(12) United States Patent
Ono et al.

(10) Patent No.: US 9,722,067 B2
(45) Date of Patent: Aug. 1, 2017

(54) SEMICONDUCTOR DEVICE

(71) Applicant: KABUSHIKI KAISHA TOSHIBA, Tokyo (JP)

(72) Inventors: Tasuku Ono, Nonoichi Ishikawa (JP); Takashi Onizawa, Nomi Ishikawa (JP); Yoshikazu Suzuki, Komatsu Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/062,201

(22) Filed: Mar. 7, 2016

(65) Prior Publication Data

US 2017/0077284 A1   Mar. 16, 2017

(30) Foreign Application Priority Data

Sep. 10, 2015   (JP) .................................. 2015-178460

(51) Int. Cl.
*H01L 29/778* (2006.01)
*H01L 29/20* (2006.01)
(Continued)

(52) U.S. Cl.
CPC ...... *H01L 29/7788* (2013.01); *H01L 29/0611* (2013.01); *H01L 29/2003* (2013.01); *H01L 29/402* (2013.01)

(58) Field of Classification Search
CPC ............. H01L 29/7788; H01L 29/0611; H01L 29/402; H01L 29/2003
See application file for complete search history.

(56) References Cited

U.S. PATENT DOCUMENTS

| 8,154,079 B2 | 4/2012 | Matsushita et al. |
| 8,592,865 B1 * | 11/2013 | Hughes ................. H01L 29/402 |
| | | 257/183 |
| 2014/0264274 A1 * | 9/2014 | Nakayama ........ H01L 29/66462 |
| | | 257/20 |

FOREIGN PATENT DOCUMENTS

| JP | 2006-222393 A | 8/2006 |
| JP | 2013-93482 A | 5/2013 |

(Continued)

OTHER PUBLICATIONS

TW Office Action dated Sep. 2, 2016 for Application No. 105107236.

*Primary Examiner* — Roy Potter
*Assistant Examiner* — Paul Patton
(74) *Attorney, Agent, or Firm* — Patterson & Sheridan, LLP

(57) ABSTRACT

A semiconductor device includes a first nitride semiconductor layer, a source electrode on the first nitride semiconductor layer, a drain electrode on the first nitride semiconductor layer, a gate electrode on the first nitride semiconductor layer and between the source electrode and the drain electrode, a gate field plate electrode that is separated from the first nitride semiconductor layer, and includes one end in direct contact with the gate electrode, and the other end positioned between the gate electrode and the drain electrode, a first interlayer insulating film that is separated from the gate electrode and is between the gate field plate electrode and the first nitride semiconductor layer, and a second interlayer insulating film that is between the gate electrode and the first interlayer insulating film and has a dielectric constant higher than a dielectric constant of the first interlayer insulating film.

19 Claims, 10 Drawing Sheets

(51) Int. Cl.
 *H01L 29/40* (2006.01)
 *H01L 29/06* (2006.01)

(56) References Cited

FOREIGN PATENT DOCUMENTS

TW     201349490 A    12/2013
TW     201448227 A    12/2014

* cited by examiner

SEMICONDUCTOR DEVICE

CROSS-REFERENCE TO RELATED APPLICATION

This application is based upon and claims the benefit of priority from Japanese Patent Application No. 2015-178460, filed Sep. 10, 2015, the entire contents of which are incorporated herein by reference.

FIELD

Embodiments of the present disclosure relate to a semiconductor device.

BACKGROUND

In a power device using Si (silicon), a low on-resistance is realized. In order to further improve breakdown voltage property of a power device, and reduce its on-resistance, the material used in the power device is changed.

For example, it is possible to further improve the breakdown voltage property of the power device and to reduce the on-resistance thereof by using wide band gap semiconductor material such as nitride semiconductor material.

DETAILED DESCRIPTION

Figure 1:
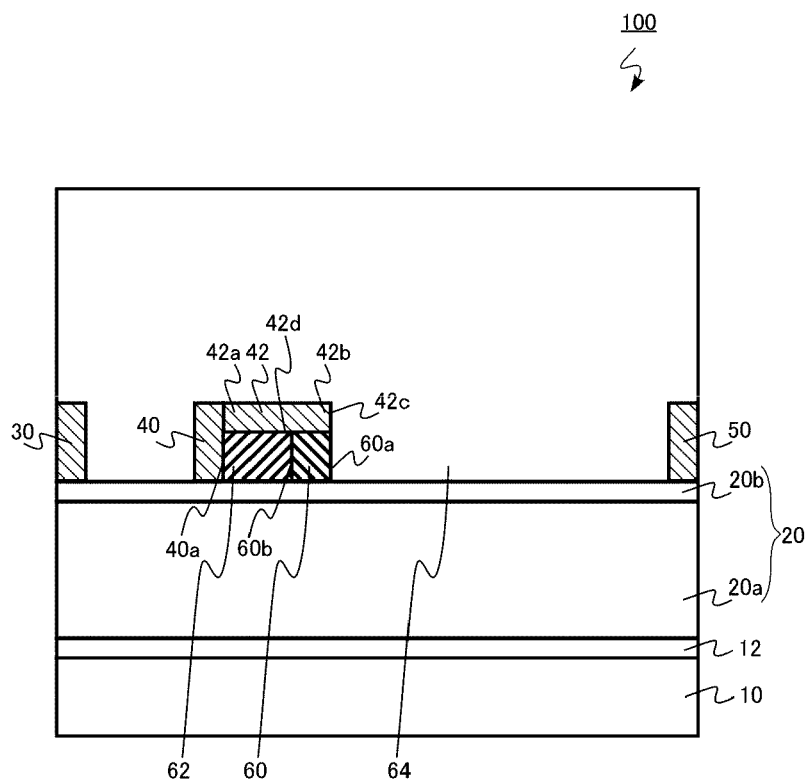
FIG. 1 is a schematic cross-sectional view of a semiconductor device according to a first embodiment.

Embodiments provide a semiconductor device having high breakdown voltage property.

In general, according to one embodiment, a semiconductor device includes a first nitride semiconductor layer, a source electrode on the first nitride semiconductor layer, a drain electrode on the first nitride semiconductor layer, a gate electrode on the first nitride semiconductor layer and between the source electrode and the drain electrode, a gate field plate electrode that is separated from the first nitride semiconductor layer, and includes one end in direct contact with the gate electrode, and the other end positioned between the gate electrode and the drain electrode, a first interlayer insulating film that is separated from the gate electrode and is between the gate field plate electrode and the first nitride semiconductor layer, and a second interlayer insulating film that is between the gate electrode and the first interlayer insulating film and has a dielectric constant higher than a dielectric constant of the first interlayer insulating film.

Embodiments of the present disclosure will be described below with reference to the accompanying drawings.

In this disclosure, the same reference numerals may be given to the same or similar elements to avoid redundant description.

The term "nitride semiconductor" used herein means a semiconductor including GaN (gallium nitride), AlN (aluminum nitride), InN (indium nitride), or an intermediate composition of any of the above.

The term "undoped" used herein means that the impurity concentration is $1 \times 10^{15}$ cm$^{-3}$ or less.

In order to represent the positional relationship between components and the like herein, the upward direction in the drawing is described as "upper", and the downward direction in the drawing as "lower". The concept of "upper" and "lower" may or may not be aligned with the direction of gravity.

First Embodiment

A semiconductor device according to the present embodiment includes: a first nitride semiconductor layer; a source electrode provided on the first nitride semiconductor layer; a drain electrode provided on the first nitride semiconductor layer; a gate electrode provided on the first nitride semiconductor layer between the source electrode and the drain electrode; a gate field plate electrode separated from the first nitride semiconductor layer, one end of which is electrically connected to the gate electrode, and the other end of which is positioned between the gate electrode and the drain electrode; a first interlayer insulating film separated from the gate electrode between the gate field plate electrode and the first nitride semiconductor layer; and a second interlayer insulating film provided between the gate electrode and the first interlayer insulating film and having a dielectric constant higher than that of the first interlayer insulating film.

FIG. 1 is a schematic cross-sectional view of a semiconductor device 100 according to the embodiment. The semiconductor device according to the embodiment is an HEMT (High Electron Mobility Transistor) using a nitride semiconductor.

The semiconductor device 100 includes a substrate 10, a second nitride semiconductor layer (buffer layer) 12, a first nitride semiconductor layer 20, a source electrode 30, a gate electrode 40, a drain electrode 50, a gate field plate electrode 42, a first interlayer insulating film 60, a second interlayer insulating film 62 and a third interlayer insulating film 64.

The substrate 10 is, for example, a Si (silicon) substrate. Besides the Si substrate, for example, a sapphire substrate or a silicon carbide (SiC) substrate may be used.

The first nitride semiconductor layer 20 is provided on the substrate 10. The first nitride semiconductor layer 20 includes a first semiconductor layer 20a, and a second semiconductor layer 20b provided on the first semiconductor layer 20a. The band gap of the second semiconductor layer 20b is larger than the band gap of the first semiconductor layer 20a.

The first semiconductor layer 20a is an undoped $Al_xGa_{1-x}N$ layer ($0 \leq X < 1$), for example. More generally, it is an undoped GaN layer. The thickness of the first semiconductor layer 20a is, for example, 0.5 µm or more and 3 µm or less. The second semiconductor layer 20b is an undoped $Al_YGa_{1-Y}N$ layer (0<Y≤1, X<Y), for example. More specifically, it is an undoped $Al_{0.2}Ga_{0.8}N$ layer, for example. The thickness of the second semiconductor layer 20b is, for example, 15 nm or more and 50 nm or less.

A heterojunction interface is formed between the first semiconductor layer 20a and the second semiconductor layer 20b. During the ON operation of the semiconductor device 100, two-dimensional electron gas (2DEG) is formed at the heterojunction interface, and the gas serves as a carrier.

The second nitride semiconductor layer (buffer layer) 12 is provided between the substrate 10 and the first nitride semiconductor layer 20. By providing the second nitride semiconductor layer (buffer layer) 12, the lattice mismatch between the substrate 10 and the first nitride semiconductor layer 20 is reduced, so that the first nitride semiconductor layer 20 having high crystallinity can be formed. Thus, a high-performance semiconductor device is achieved. The second nitride semiconductor layer 12 has a multi-layer structure made of, for example, aluminum gallium nitride ($Al_WGa_{1-W}N$ (0<W<1)).

The source electrode 30 and the drain electrode 50 are provided on the first nitride semiconductor layer 20. The gate electrode 40 is provided on the first nitride semiconductor layer 20 between the source electrode 30 and the drain electrode 50.

The source electrode 30, the gate electrode 40 and the drain electrode 50 are, for example, metal electrodes. A metal electrode serving as the source electrode 30 and the drain electrode 50 has a stacked structure of, for example, titanium (Ti) and aluminum (Al). A metal electrode serving as the gate electrode 40 has a stacked structure of nickel (Ni) and gold (Au). Preferably, an ohmic junction is formed between each of the source electrode 30 and the drain electrode 50, and the first nitride semiconductor layer 20 (in particular, the second semiconductor layer 20b). The distance between the source electrode 30 and the drain electrode 50 is, for example, 5 µm or more and 30 µm or less.

The gate field plate electrode 42 is separated from the first nitride semiconductor layer 20. One end 42a of the gate field plate electrode 42 is electrically connected to the gate electrode 40. The one end 42a of the gate field plate electrode 42 is also physically connected to the gate electrode 40, for example. The other end 42b of the gate field plate electrode 42 is arranged between the gate electrode 40 and the drain electrode 50.

The gate field plate electrode 42 is used to reduce the electric field concentration in the semiconductor device 100. The gate field plate electrode 42 is made of electrically conductive material, such as Au (gold), by a plating method, for example.

The first interlayer insulating film 60 is arranged between the gate field plate electrode 42 and the first nitride semiconductor layer 20. The first interlayer insulating film 60 is separated from the gate electrode 40.

The second interlayer insulating film 62 is arranged between the gate field plate electrode 42 and the first nitride semiconductor layer 20. The second interlayer insulating film 62 is provided between the gate electrode 40 and the first interlayer insulating film 60. The dielectric constant of the second interlayer insulating film 62 is higher than that of the first interlayer insulating film 60.

The third interlayer insulating film 64 is provided on the first nitride semiconductor layer 20. The third interlayer insulating film 64 is provided between the first interlayer insulating film 60 and the drain electrode 50.

Next, an example of a method of manufacturing the semiconductor device 100 according to the embodiment will be described. FIGS. 2 to 7 are schematic cross-sectional views of the semiconductor device 100 during manufacturing of the semiconductor device 100.

The method of manufacturing the semiconductor device according to the embodiment includes: forming first and second nitride semiconductor layer on a substrate by an epitaxial growth method, wherein the second nitride semiconductor layer is formed on the substrate, and a first semiconductor layer of the first nitride semiconductor layer is formed on the second nitride semiconductor layer and a second semiconductor layer of the first nitride semiconductor layer is formed on the first semiconductor layer of the first nitride semiconductor layer, forming a source electrode, a gate electrode and a drain electrode on the second semiconductor layer of the first nitride semiconductor layer, forming a first interlayer insulating film on the second semiconductor layer of the first nitride semiconductor layer between the gate electrode and the drain electrode, forming a second interlayer insulating film on the second semiconductor layer of the first nitride semiconductor layer between the gate electrode and the first interlayer insulating film, the second interlayer insulating film having a dielectric constant higher than that of the first interlayer insulating film, forming a gate field plate electrode separated from the second semiconductor layer of the first nitride semiconductor layer on the first and second interlayer insulating films, one end of the gate field plate electrode being electrically connected to the gate electrode, and the other end of the gate field plate electrode being positioned between the gate electrode and the drain electrode, and forming a third interlayer insulating film between the first interlayer insulating film and the drain electrode, the third interlayer insulating film having a dielectric constant higher than that of the first interlayer insulating film.

Figure 2:
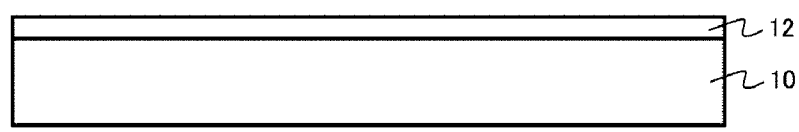
FIGS. 2-7 are each a schematic cross-sectional view of the semiconductor device according to the first embodiment as it is being manufactured.

First, the second nitride semiconductor layer 12 is formed on the substrate 10 by an epitaxial growth method, for example (FIG. 2).

Figure 3:
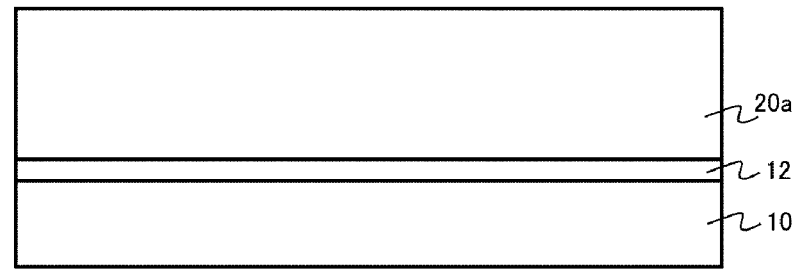

Next, the first semiconductor layer 20a is formed on the second nitride semiconductor layer 12 by the epitaxial growth method, for example (FIG. 3).

Figure 4:
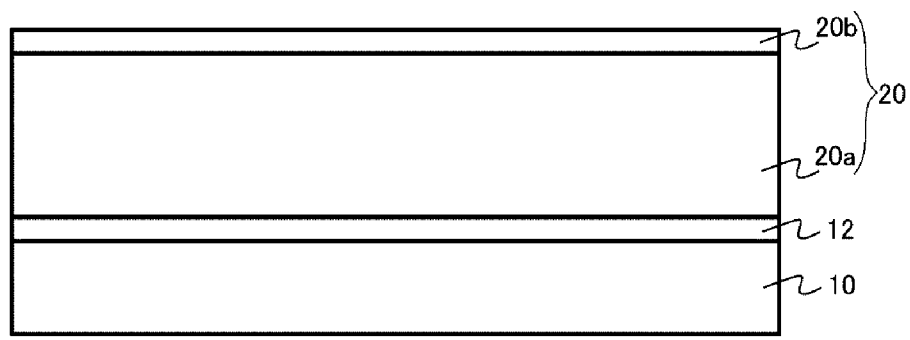

Next, the second semiconductor layer 20b is formed on the first semiconductor layer 20a by the epitaxial growth method, for example (FIG. 4).

Next, the source electrode 30, the gate electrode 40 and the drain electrode 50 are formed on the second semiconductor layer 20b by a lift-off method, for example. Next, the first interlayer insulating film 60 is formed on the second semiconductor layer 20b between the gate electrode 40 and the drain electrode 50. Next, the second interlayer insulating film 62 is formed on the second semiconductor layer 20b between the gate electrode 40 and the first interlayer insulating film 60.

Figure 5:
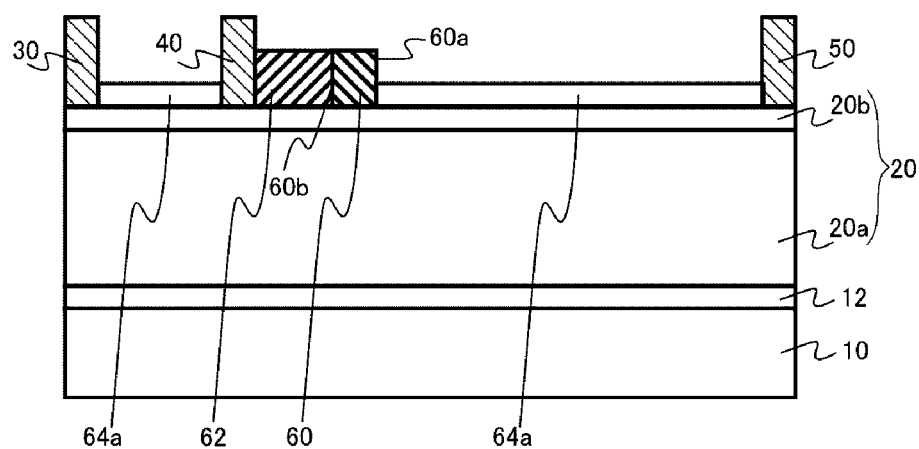

It is preferable that a portion 64a of the third interlayer insulating film 64 is formed on the second semiconductor layer 20b between the source electrode 30 and the gate electrode 40 (FIG. 5). This prevents the gate field plate electrode 42, which will be described below, from being formed directly on the second semiconductor layer 20b, and causing the second semiconductor layer 20b to be damaged. Similarly, it is preferable that a portion 64a of the third interlayer insulating film 64 is formed on the second semiconductor layer 20b between the drain electrode 50 and the first interlayer insulating film 60 (FIG. 5).

Figure 6:
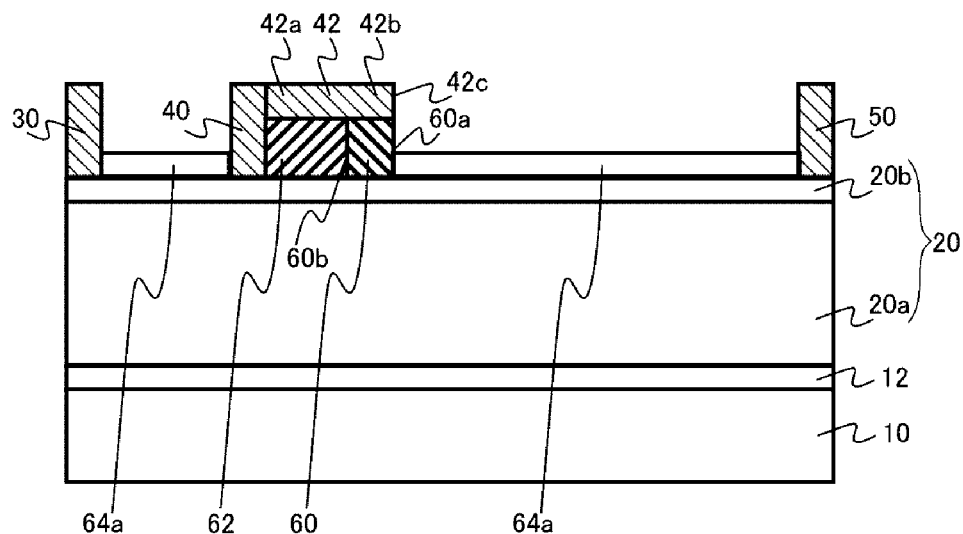

Then, the gate field plate electrode 42 is formed on the first interlayer insulating film 60 and the second interlayer insulating film 62 by the plating method, for example (FIG. 6).

Figure 7:
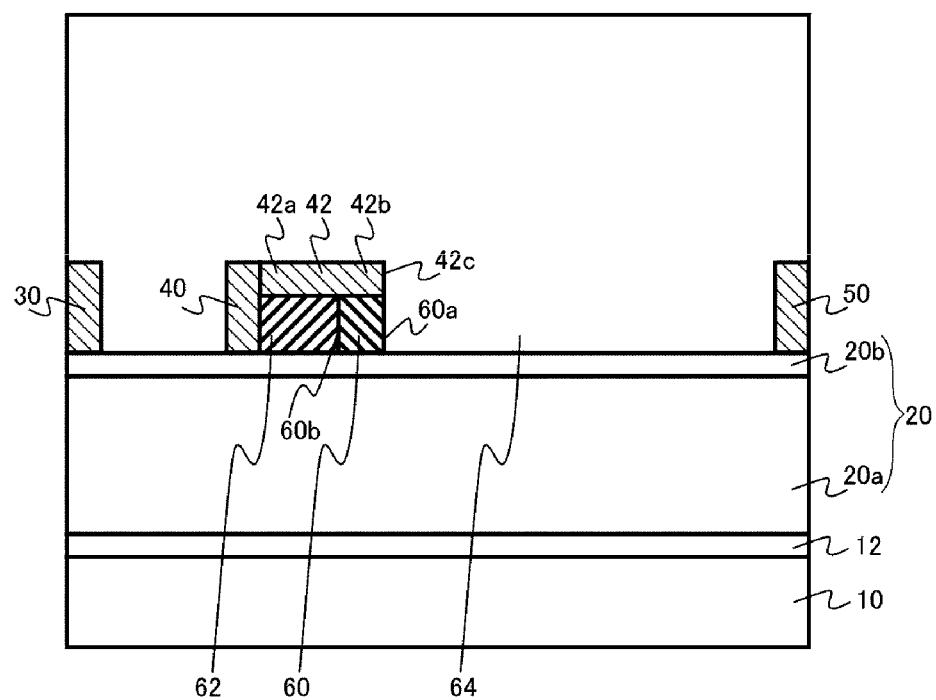

Finally, the third interlayer insulating film 64 is formed between the first interlayer insulating film 60 and the drain electrode 50 and between the source electrode 30 and the gate electrode 40, thus, the semiconductor device 100 is obtained (FIG. 7).

Next, the operation and the effect of the semiconductor device 100 according to the embodiment will be described.

Figure 8:
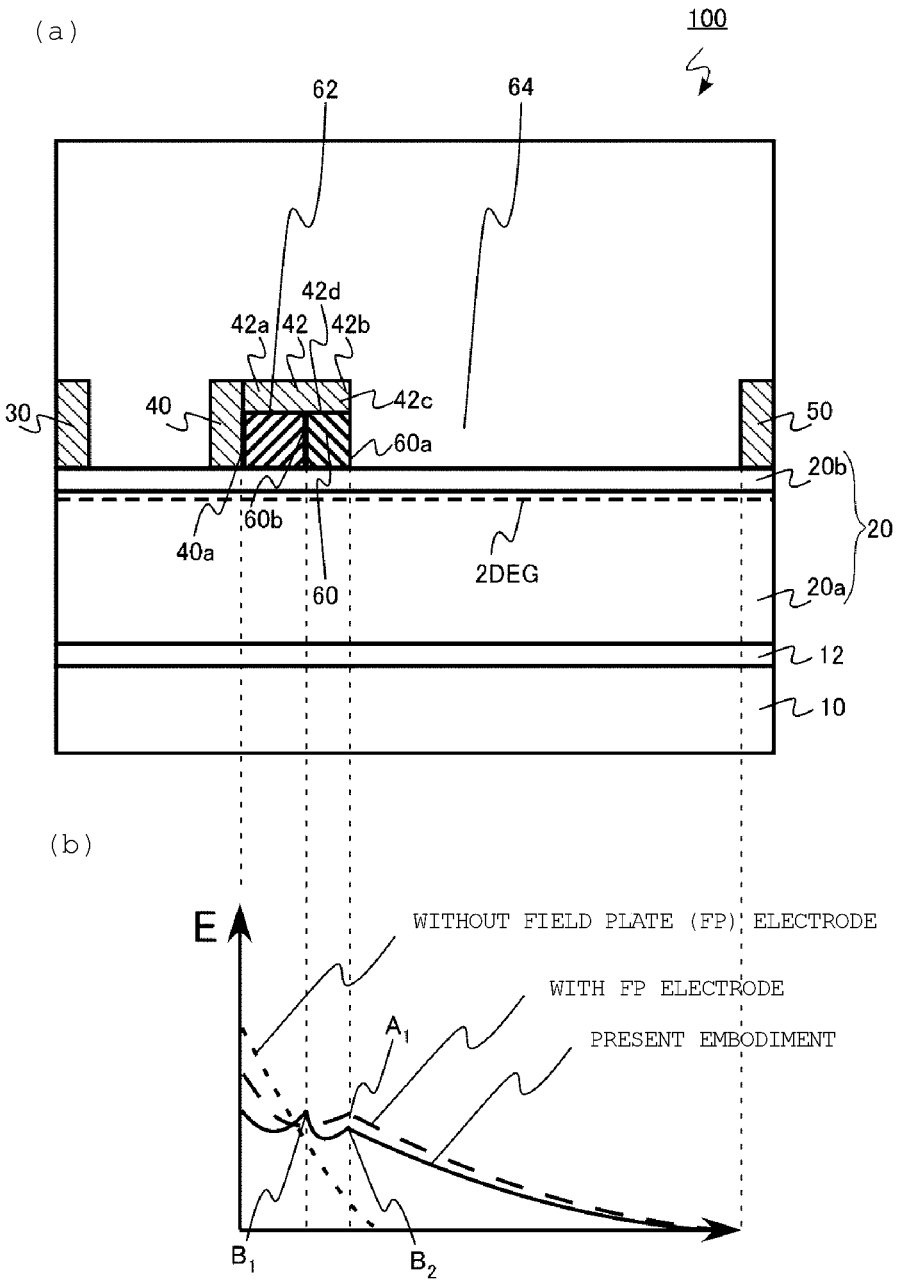
FIG. 8 is a schematic diagram illustrating magnitude and location of an electric field applied to the semiconductor device according to the first embodiment.

FIG. 8 is diagram illustrating the operation and the effect of the semiconductor device 100 according to the embodiment. Section (a) of FIG. 8 is a schematic cross-sectional view of the semiconductor device 100 according to the embodiment, and section (b) of FIG. 8 is a schematic view showing a lateral electric field E applied to the semiconductor device 100 according to the embodiment shown in section (a) of FIG. 8.

If a high electric field is applied to the semiconductor device using nitride semiconductor material, the semiconductor device may be destroyed. For example, an electric flux line in the electric field E applied between the drain electrode 50 and the source electrode 30 tends to enter into or exit from an end surface 40*a* at one end of the gate electrode. This is because the gate electrode 40 is located in a portion closer to the drain electrode 50 than the source electrode 30. Thus, as shown by the broken line in section (b) of FIG. 8 (without a field plate (FP) electrode), a strong electric field E is applied at the vicinity of the end surface 40*a* at one end of the gate electrode, which is likely to cause the semiconductor device 100 to be damaged.

In the semiconductor device on which the gate field plate electrode 42 is provided, the electric flux line in the electric field E applied between the drain electrode 50 and the source electrode 30 is dispersed so that it enters into the vicinity of the end surface 40*a* at one end of the gate electrode and the vicinity of an end surface 42*c* at the other end of the gate field plate electrode. Therefore, as shown by the broken line in section (b) of FIG. 8 (with an FP electrode), a local maximum portion $A_1$ of the electric field E is provided in the vicinity of the end surface 42*c* at the other end of the gate field plate electrode, and the strength of the electric field in the vicinity of the end surface 40*a* at the one end of the gate electrode is reduced.

In order to further increase a breakdown voltage, an approach of further providing a plurality of gate field plate electrodes is provided. However, it is difficult to manufacture a plurality of gate field plate electrodes.

In the semiconductor device 100 according to the embodiment, the dielectric constant of the second interlayer insulating film 62 and the dielectric constant of the third interlayer insulating film 64 are each higher than the dielectric constant of the first interlayer insulating film 60. Therefore, a part of the electric flux line directly entering into the other end 42*c* of the gate field plate electrode through the third interlayer insulating film 64 from the drain electrode 50 enters into the gate field plate electrode 42 through the first interlayer insulating film 60 and a lower surface 42*d* of the gate field plate electrode. Therefore, the strength of the local maximum portion of the electric field in the vicinity of a first end surface 60*a* of the first interlayer insulating film 60 is reduced to $B_2$, as shown by the solid line (the present embodiment) in section (b) of FIG. 8.

In addition, a part of the electric flux line entering into the vicinity of the end surface 40*a* at one end of the gate electrode enters into the gate field plate electrode 42 from the lower surface 42*d* of the gate field plate electrode through the first interlayer insulating film 60 having the relative dielectric constant lower than that of the second interlayer insulating film 62. Therefore, the strength of the electric field E in the vicinity of a second end surface 60*b* of the first interlayer insulating film is increased to $B_1$. On the other hand, the strength of the electric field in the vicinity of the end surface 40*a* at one end of the gate electrode is reduced. Therefore, it is possible to reduce the strength of the maximum electric field applied to the semiconductor device 100. Therefore, it is possible to increase the breakdown voltage of the semiconductor device 100. In other words, according to the semiconductor device 100 according to the embodiment, the field plate effect can be multi-staged without providing a plurality of gate field plate electrodes.

Figure 9A:
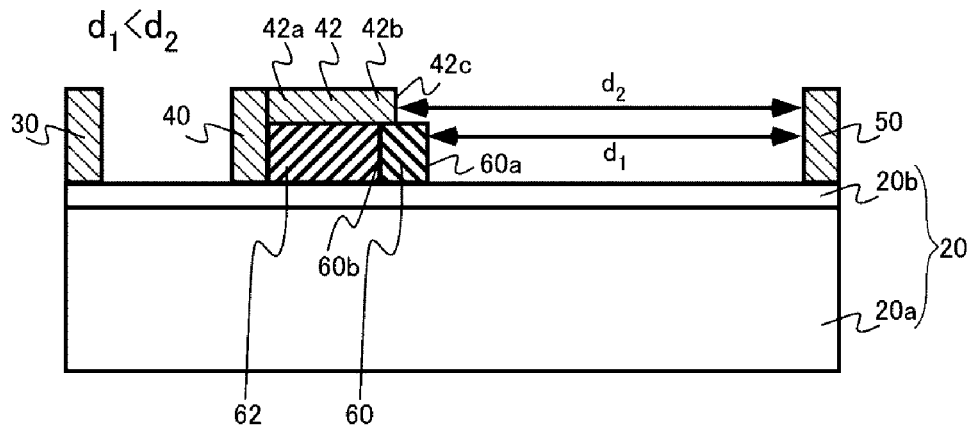
FIGS. 9A to 9C are schematic cross-sectional views of alternative configurations of the semiconductor device according to the first embodiment.
Figure 9B:
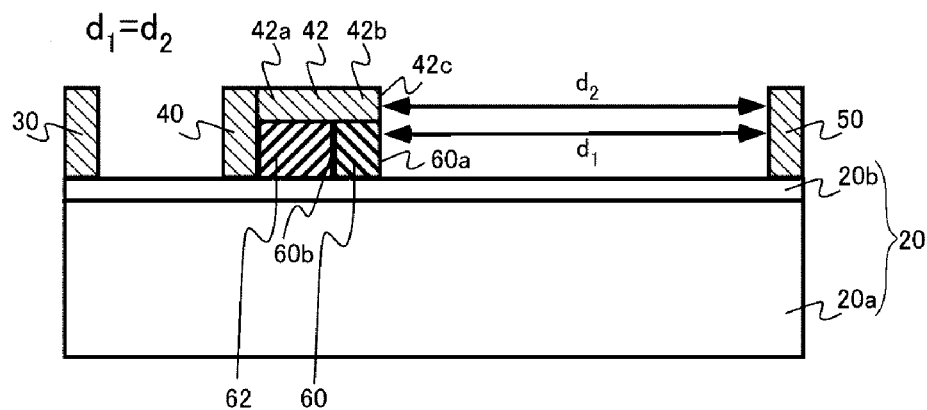
Figure 9C:
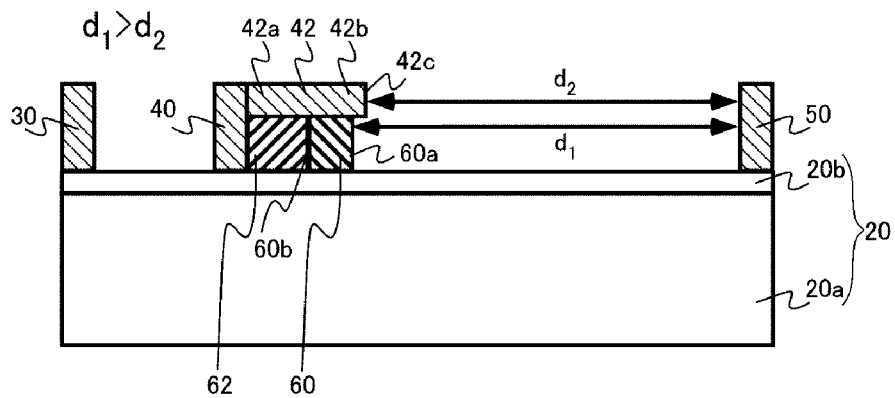

FIGS. 9A to 9C are schematic cross-sectional views of alternative configurations of the semiconductor device 100 according to the embodiment. In the semiconductor device 100 according to the embodiment, more electric flux lines in the vicinity of the end surface 42*c* at the other end of the gate field plate electrode pass through the first interlayer insulating film 60, so as to effectively reduce the electric field concentration in the vicinity of the end surface 42*c* at the other end of the gate field plate electrode. Thus, it is preferable that the distance between the first end surface 60*a* of the first interlayer insulating film and the drain electrode 50 be equal to or less than the distance between the end surface 42*c* at the other end of the gate field plate electrode and the drain electrode 50. Here, in FIG. 9A, a distance $d_1$ between the first end surface 60*a* of the first interlayer insulating film and the drain electrode 50 is smaller than a distance $d_2$ between the end surface 42*c* at the other end of the gate field plate electrode and the drain electrode 50 ($d_1 < d_2$). In FIG. 9B, the distance $d_1$ between the first end surface 60*a* of the first interlayer insulating film and the drain electrode 50 is equal to the distance $d_2$ between the end surface 42*c* at the other end of the gate field plate electrode and the drain electrode 50 ($d_1 = d_2$). In FIG. 9C, the distance $d_1$ between the first end surface 60*a* of the first interlayer insulating film and the drain electrode 50 is larger than the distance $d_2$ between the end surface 42*c* at the other end of the gate field plate electrode and the drain electrode 50 ($d_1 > d_2$). In the embodiment, the semiconductor devices shown in FIGS. 9A and 9B are more preferable. Note that, in the semiconductor device 100 shown in FIG. 1, $d_1 = d_2$. Further, in the semiconductor device 100 according to the embodiment, $d_1$ is measured using the first end surface 60*a* of the first interlayer insulating film closer to the drain electrode 50 than the second end surface 60*b* of the first interlayer insulating film.

Preferably, the dielectric constant of the third interlayer insulating film 64 is higher than the dielectric constant of the first interlayer insulating film 60. When the dielectric constant of the third interlayer insulating film 64 is higher than the dielectric constant of the first interlayer insulating film 60, the ratio of electric flux lines that pass through the first interlayer insulating film 60 having the lower dielectric constant is increased. Therefore, it is possible to further increase the breakdown voltage of the semiconductor device 100.

It is preferable that the first interlayer insulating film 60 is formed of silicon oxide, benzocyclobutene or polyimide when an interlayer insulating layer having a lower dielectric constant is formed. In addition, it is preferable that the second interlayer insulating film 62 and the third interlayer insulating film 64 are formed of silicon nitride, aluminum oxide, strontium titanate or barium titanate when an interlayer insulating film having a higher dielectric constant is formed. Note that the third interlayer insulating film 64 may be formed using the same material as that of the second interlayer insulating film 62.

It is preferable that the first interlayer insulating film 60 is in direct contact with the gate field plate electrode 42 and the first nitride semiconductor layer 20 (second semiconductor layer 20b) so that many electric flux lines pass through the first interlayer insulating film 60 so as to further effectively reduce electric field concentration.

According to the semiconductor device 100 according to the embodiment, it is possible to provide a semiconductor device having high breakdown voltage property.

Second Embodiment

A semiconductor device 200 according to the present embodiment includes: a first nitride semiconductor layer; a source electrode provided on the first nitride semiconductor layer; a drain electrode provided on the first nitride semiconductor layer; a gate electrode provided on the first nitride semiconductor layer between the source electrode and the drain electrode; a source field plate electrode separated from the first nitride semiconductor layer, one end of which is electrically connected to the source electrode, and the other end of which is positioned between the source electrode and the drain electrode; a fourth interlayer insulating film separated from the source electrode between the source field plate electrode and the first nitride semiconductor layer; and a fifth interlayer insulating film provided between the source electrode and the fourth interlayer insulating film and having a dielectric constant higher than that of the fourth interlayer insulating film. Here, the description overlapping with the semiconductor device according to the first embodiment will be omitted.

Figure 10:
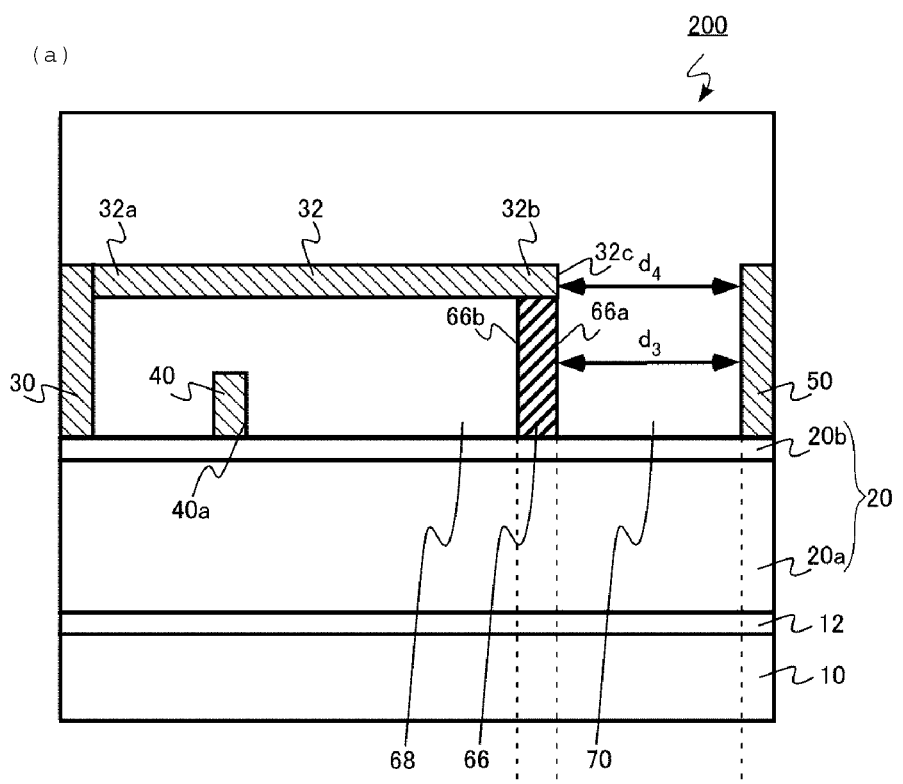
FIG. 10 is a schematic cross-sectional view of a semiconductor device according to a second embodiment.
Figure 10:
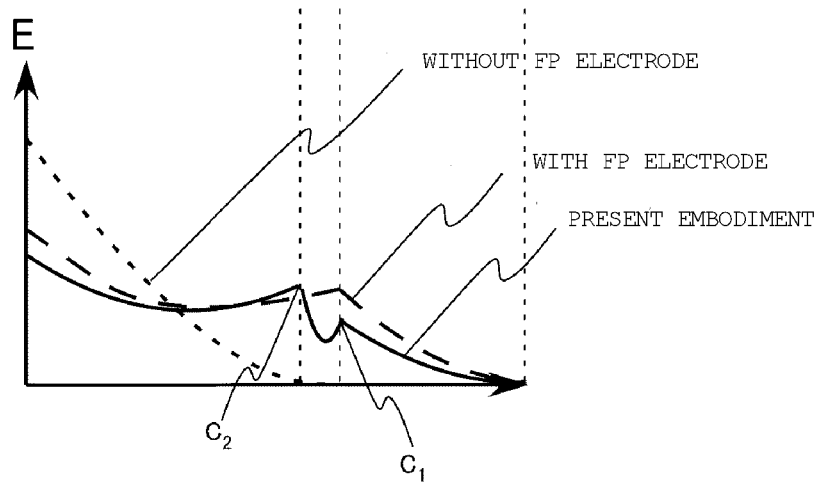

FIG. 10 is schematic view of a semiconductor device 200 according to the embodiment. Section (a) of FIG. 10 is a schematic cross-sectional view of the semiconductor device 200 according to the embodiment, and section (b) of FIG. 10 is a schematic view showing a lateral electric field E applied to the two-dimensional electron gas in the semiconductor device 200 according to the embodiment shown in section (a) FIG. 10. A source field plate electrode 32 is separated from the first nitride semiconductor layer 20. One end 32a of the source field plate electrode 32 is electrically connected to the source electrode 30. The one end 32a of the source field plate electrode 32 is also physically connected to the source electrode 30, for example. The other end 32b of the source field plate electrode 32 is arranged between the gate electrode 40 and the drain electrode 50.

The source field plate electrode 32 is used to reduce the electric field concentration in the semiconductor device 100. The source field plate electrode 32 is made of electrically conductive material, such as Au (gold), by a plating method, for example.

A fourth interlayer insulating film 66 is arranged between the source field plate electrode 32 and the first nitride semiconductor layer 20. The fourth interlayer insulating film 66 is separated from the source electrode 30 and the gate electrode 40.

A fifth interlayer insulating film 68 is arranged between the source field plate electrode 32 and the first nitride semiconductor layer 20. The fifth interlayer insulating film 68 is provided between the source electrode 30 and the fourth interlayer insulating film 60. The dielectric constant of the fifth interlayer insulating film 68 is higher than that of the fourth interlayer insulating film 66.

A sixth interlayer insulating film 70 is provided on the first nitride semiconductor layer 20. The sixth interlayer insulating film 70 is provided between the fourth interlayer insulating film 66 and the drain electrode 50.

In order to efficiently reduce an electric field concentration by increasing the number of electric flux lines entering into and exiting from the other end 32b of the source field plate electrode, it is preferable that the distance between another end 32c of the source field plate electrode and the drain electrode 50 is shorter than the distance between the end surface 40a at one end of the gate electrode and the drain electrode 50.

In the semiconductor device 200 according to the embodiment, in order to further effectively reduce the electric field concentration, it is preferable that a distance d3 between a first end surface 66a of the fourth interlayer insulating film and the drain electrode 50 is equal to or less than a distance d4 between the end surface 32c at the other end of the source field plate electrode and the drain electrode 50 (d3≤d4). Note that the fourth interlayer insulating film 66 has the first end surface 66a of the fourth interlayer insulating film and a second end surface 66b of the fourth interlayer insulating film. However, in the embodiment, the first end surface 66a of the fourth interlayer insulating film closer to the drain electrode 50 is used to measure d3.

It is preferable that the fourth interlayer insulating film 66 is in direct contact with the source field plate electrode 32 and the first nitride semiconductor layer 20 (second semiconductor layer 20b) so that more electric flux lines pass through the fourth interlayer insulating film 66 so as to further effectively reduce electric field concentration.

In the electric field distribution of the semiconductor device 200 according to the embodiment, as shown in section (b) of FIG. 10, two (C1, C2) local maximum portions are provided in the vicinity of the first end surface 66a of the fourth interlayer insulating film and the second end surface 66b of the fourth interlayer insulating film. Accordingly, the strength of the electric field in the vicinity of the end surface 40a at one end of the gate electrode is reduced. Therefore, it is possible to increase the breakdown voltage of the semiconductor device 200.

According to the semiconductor device 200 according to the embodiment, it is possible to provide a semiconductor device having high breakdown voltage property.

Third Embodiment

A semiconductor device 300 according to the present embodiment includes: a first nitride semiconductor layer; a source electrode provided on the first nitride semiconductor layer; a drain electrode provided on the first nitride semiconductor layer; a gate electrode provided on the first nitride semiconductor layer between the source electrode and the drain electrode; a gate field plate electrode separated from the first nitride semiconductor layer, one end of which is electrically connected to the gate electrode, and the other end of which is positioned between the gate electrode and the drain electrode; a source field plate electrode provided above the gate field plate electrode, separated from the first nitride semiconductor layer, the gate electrode, and the gate field plate electrode, one end of which is electrically connected to the source electrode, and the other end of which is positioned between the gate electrode and the drain electrode; a first interlayer insulating film separated from the gate electrode between the gate field plate electrode and the first nitride semiconductor layer; a second interlayer insulating film provided between the gate electrode and the first interlayer insulating film and having a dielectric constant higher than that of the first interlayer insulating film; a fourth interlayer insulating film separated from the source electrode between the source field plate electrode and the first nitride semiconductor layer; a fifth interlayer insulating film provided between the source electrode and the fourth interlayer insulating film and having a dielectric constant higher than that of the first interlayer insulating film and the fourth interlayer insulating film; and a sixth interlayer insulating film provided between the drain electrode and the fourth interlayer insulating film and having a dielectric constant higher than that of the fourth interlayer insulating film. Here, the description overlapping with the first and second embodiments will be omitted.

Figure 11:
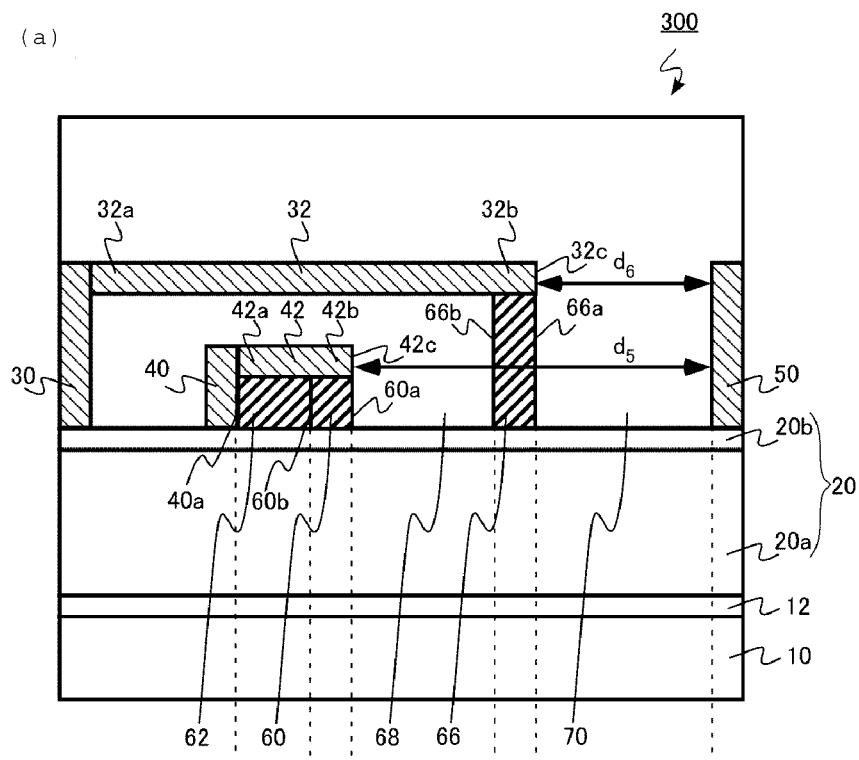
FIG. 11 is a schematic cross-sectional view of a semiconductor device according to a third embodiment.
Figure 11:
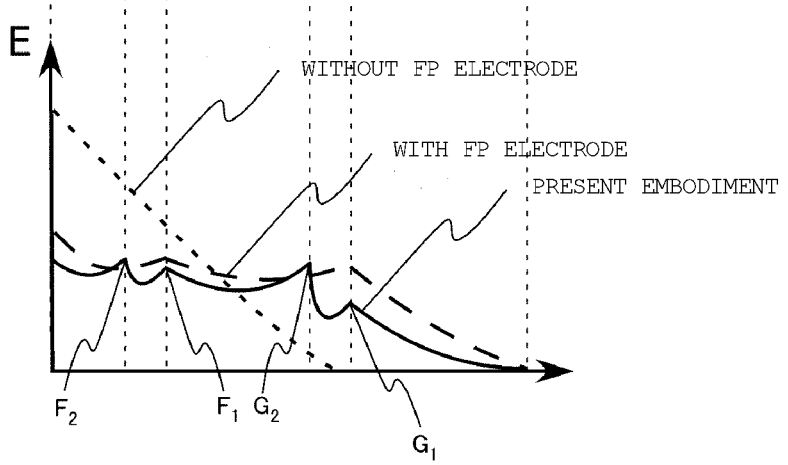

FIG. 11 is schematic view of a semiconductor device 300 according to the embodiment. Section (a) of FIG. 11 is a schematic cross-sectional view of the semiconductor device 300 according to the embodiment, and section (b) of FIG. 11 is a schematic view showing a vertical electric field E applied to the semiconductor device 300 according to the embodiment shown in section (a) of FIG. 11.

The semiconductor device 300 according to the embodiment includes both the gate field plate electrode 42 and the source field plate electrode 32. Here, in order to effectively reduce the electric field concentration by the gate field plate electrode 42 and the source field plate electrode 32, it is preferable that a distance d5 between the end surface 42c at the other end of the gate field plate electrode and the drain electrode is longer than a distance d6 between the end face 32c at the other end of the source field plate electrode and the drain electrode.

It is preferable that the first interlayer insulating film 60 and the fourth interlayer insulating film 66 be formed of, for example, silicon oxide, benzocyclobutene or polyimide because these interlayer insulating films have a relatively lower dielectric constant. In addition, it is preferable that the second interlayer insulating film 62, the fifth interlayer insulating film 68 and the sixth interlayer insulating film 70 be formed of, for example, silicon nitride, aluminum oxide, strontium titanate or barium titanate because these interlayer insulating films have a relatively higher dielectric constant.

In the semiconductor device 300 according to the embodiment, as shown in section (b) of FIG. 11, two (F1, F2) local maximum portions in the electric field E are provided in the vicinity of the first end surface 60a of the first interlayer insulating film and the second end surface 60b of the first interlayer insulating film, and two (G1, G2) local maximum portions are provided in the vicinity of the first end surface 66a of the fourth interlayer insulating film and the second end surface 66b of the fourth interlayer insulating film. Therefore, the strength of the electric field in the vicinity of the one end 40a of the gate electrode is reduced, increasing the breakdown voltage of the semiconductor device 300.

According to the semiconductor device 300 according to the embodiment, it is possible to provide a semiconductor device having high breakdown voltage property.

Fourth Embodiment

A semiconductor device 400 according to the embodiment is different from the semiconductor device according to the third embodiment in that a seventh interlayer insulating film 72 having a dielectric constant larger than that of the first interlayer insulating film 60 and smaller than that of the second interlayer insulating film 62 is further provided between the first interlayer insulating film 60 and the second interlayer insulating film 62, and an eighth interlayer insulating film 74 having a dielectric constant larger than that of the fourth interlayer insulating film 66 and smaller than that of the fifth interlayer insulating film 68 is further provided between the fourth interlayer insulating film 66 and the fifth interlayer insulating film 68. Here, the description overlapping with the first to third embodiments will be omitted.

Figure 12:
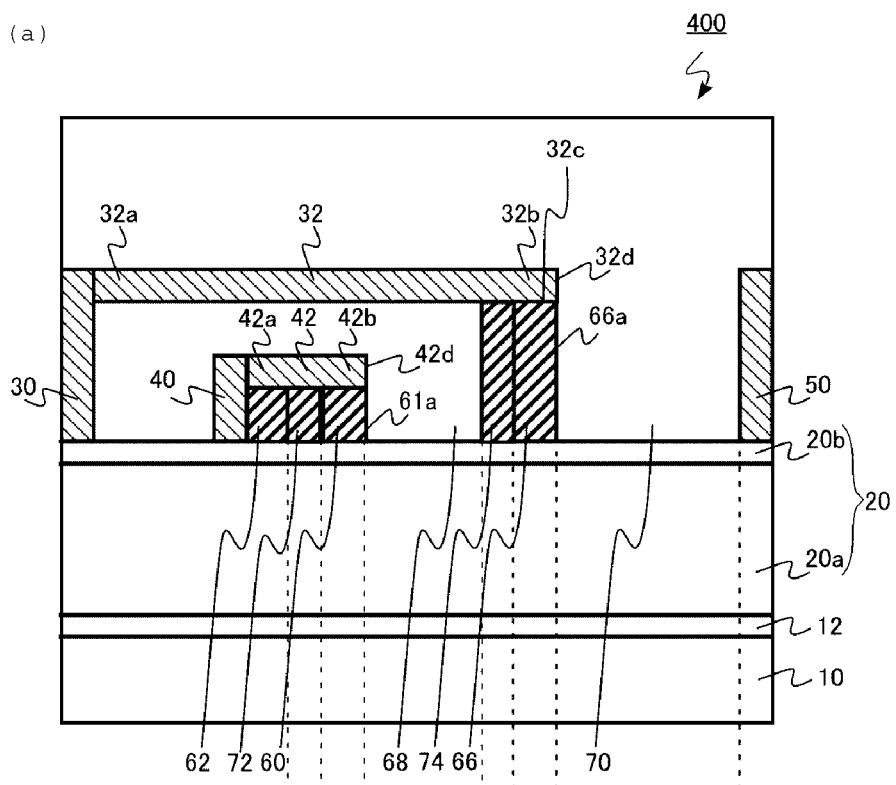
FIG. 12 is a schematic cross-sectional view of a semiconductor device according to a fourth embodiment.
Figure 12:
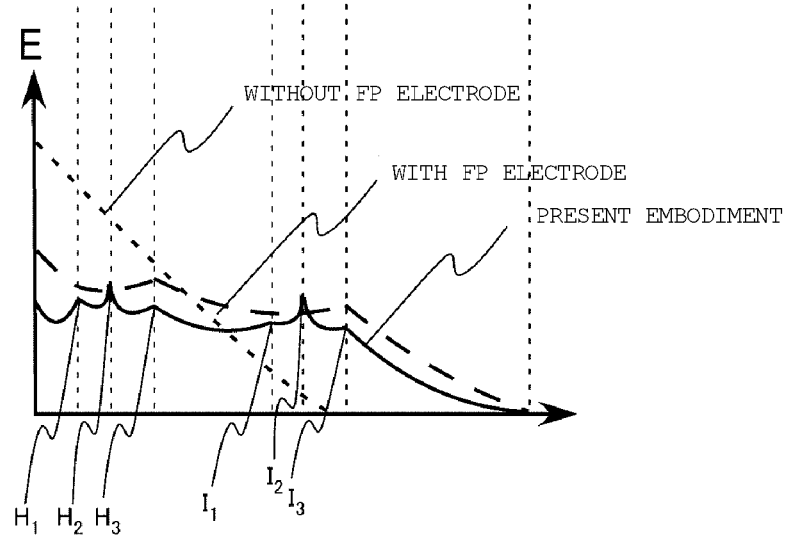

FIG. 12 is schematic view of the semiconductor device 400 according to the embodiment.

The seventh interlayer insulating film 72 and the eighth interlayer insulating film 74 may be manufactured by appropriately mixing, for example, silicon oxide, benzocyclobutene, polyimide, silicon nitride, aluminum oxide, strontium titanate or barium titanate.

In order to further effectively reduce the electric field concentration, it is preferable that the seventh interlayer insulating film 72 is in direct contact with the gate field plate electrode 42 and the first nitride semiconductor layer 20 (second semiconductor layer 20b), respectively, and the eighth interlayer insulating film 74 is in direct contact with the source field plate electrode 32 and the first nitride semiconductor layer 20 (second semiconductor layer 20b), respectively.

In the semiconductor device 400 according to the embodiment, as shown in (b) of FIG. 12, a total of six local maximum portions, $H_1$, $H_2$, $H_3$, $I_1$, $I_2$ and $I_3$ appear in the electric field distribution. Thus, it is possible to further increase the breakdown voltage.

According to the semiconductor device 400 according to the embodiment, it is possible to provide a semiconductor device having high breakdown voltage property.

Fifth Embodiment

A semiconductor device 500 according to the embodiment is different from the semiconductor device according to the first embodiment in that a gate insulating film is further provided between the first nitride semiconductor layer and the gate electrode. Here, the description overlapping with the first embodiment will be omitted.

Figure 13:
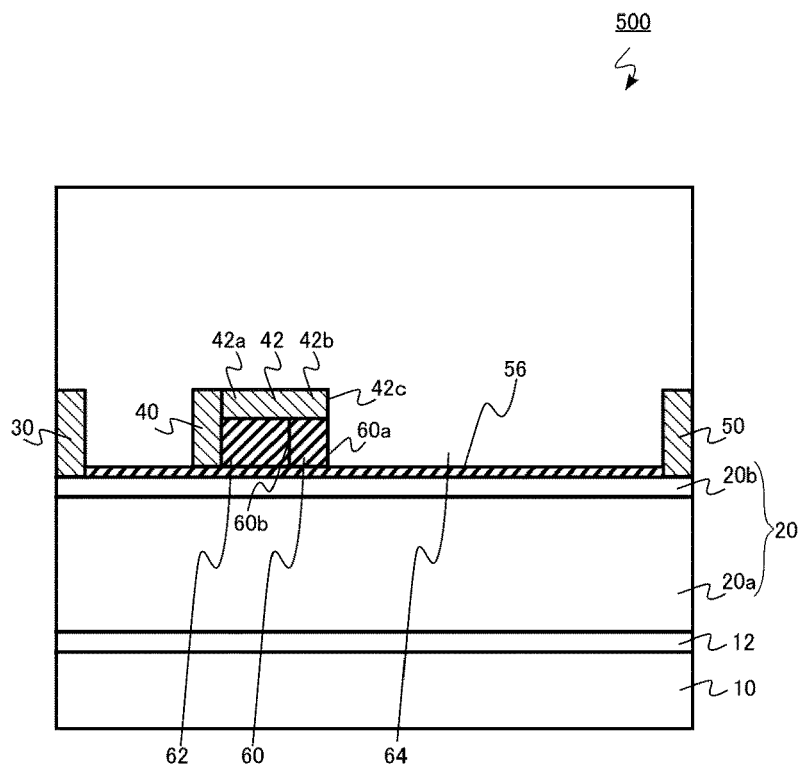
FIG. 13 is a schematic cross-sectional view of a semiconductor device according to a fifth embodiment.

FIG. 13 is a schematic cross-sectional view of the semiconductor device 500 according to the embodiment.

The material of a gate insulating film 56 is, for example, silicon nitride film, an aluminum nitride film, a silicon oxynitride film or an aluminum oxynitride film. In order to form a favorable gate insulating film to operate the semiconductor device 500, it is preferable that the dielectric constant of the gate insulating film 56 is equal to or more than that of the first interlayer insulating film 60 and is equal to or less than that of the second interlayer insulating film 62.

Also in the semiconductor device 500 according to the embodiment, it is possible to provide a semiconductor device having high breakdown voltage property. Further, the gate insulating film 56 is provided so as to suppress a gate leakage current.

Sixth Embodiment

A semiconductor device 600 according to the embodiment is different from the semiconductor device according to the first to fifth embodiments in that a p-type third nitride semiconductor layer (cap layer) is further provided between the first nitride semiconductor layer and a gate electrode. Here, the description overlapping with the first to fifth embodiments will be omitted.

Figure 14:
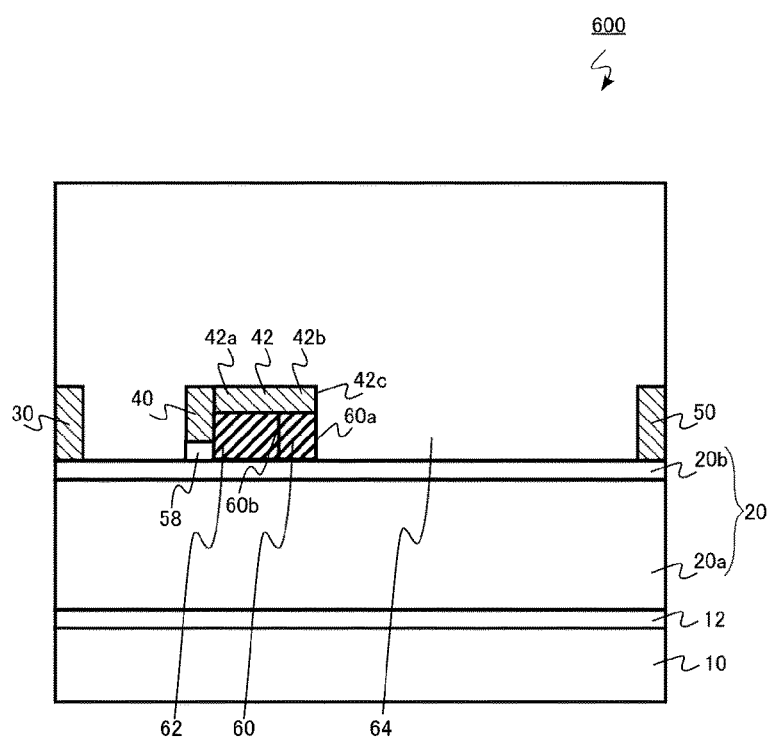
FIG. 14 is a schematic cross-sectional view of a semiconductor device according to a sixth embodiment.

FIG. 14 is a schematic cross-sectional view of the semiconductor device 600 according to the embodiment.

A third nitride semiconductor layer 58 is formed of, for example, a p-type $Al_UGa_{1-U}N$ ($0 \leq U < 1$). More generally, the layer 58 is formed of, for example, a p-type GaN. The thickness of the third nitride semiconductor layer 58 is, for example, 50 nm or more and 200 nm or less. The semiconductor device 600 according to the embodiment is a normally-off semiconductor device.

In the semiconductor device 600 according to the embodiment, it is possible to provide a normally-off semiconductor device having high breakdown voltage property.

Seventh Embodiment

A semiconductor device 700 according to the embodiment is different from the semiconductor device of the first to sixth embodiments in that the distance between the gate electrode and the substrate is shorter than the distance between the source electrode and the substrate. Here, the description overlapping with the first to sixth embodiments will be omitted.

Figure 15:
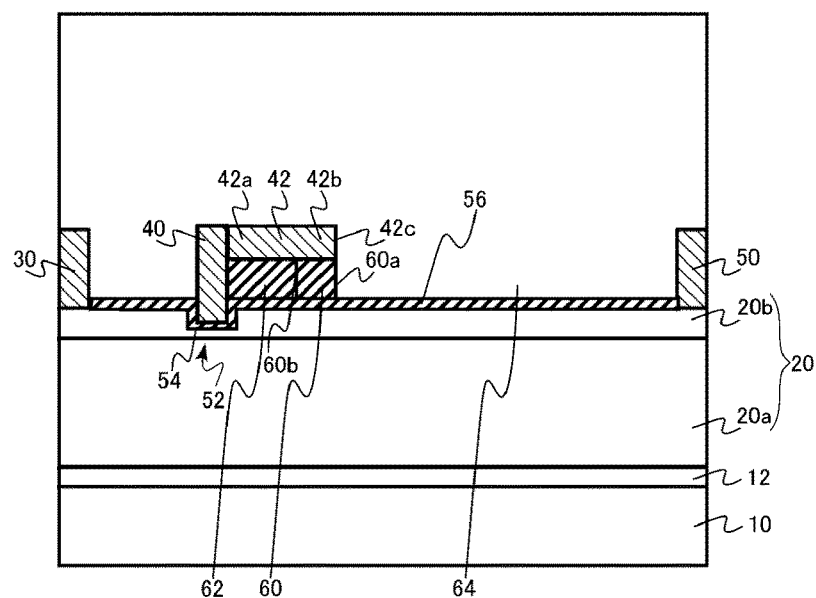
FIG. 15 is a schematic cross-sectional view of a semiconductor device according to a seventh embodiment.

FIG. 15 is a schematic cross-sectional view of the semiconductor device 700 according to the embodiment.

In the semiconductor device 700 according to the embodiment, the second semiconductor layer 20*b* has a groove (trench or recess) 52 provided thereon. A portion of the gate electrode 40 is provided in the groove 52. A groove bottom 54 is provided in the second semiconductor layer 20*b*. Further, the gate insulating film 56 is provided between the gate electrode 40 and the groove bottom 54. Therefore, the distance between the gate electrode 40 and the substrate 10 is shorter than the distance between the source electrode 30 and the substrate 10. The semiconductor device 700 according to the embodiment is a normally-off semiconductor device.

In the semiconductor device 700 according to the embodiment, it is possible to provide a normally-off semiconductor device having high breakdown voltage property.

Eighth Embodiment

A semiconductor device 800 according to the embodiment is different from the semiconductor device 700 according to the seventh embodiment in that the bottom of the groove is provided in the first semiconductor layer 20*a*. Here, the description overlapping with the first to seventh embodiments will be omitted.

Figure 16:
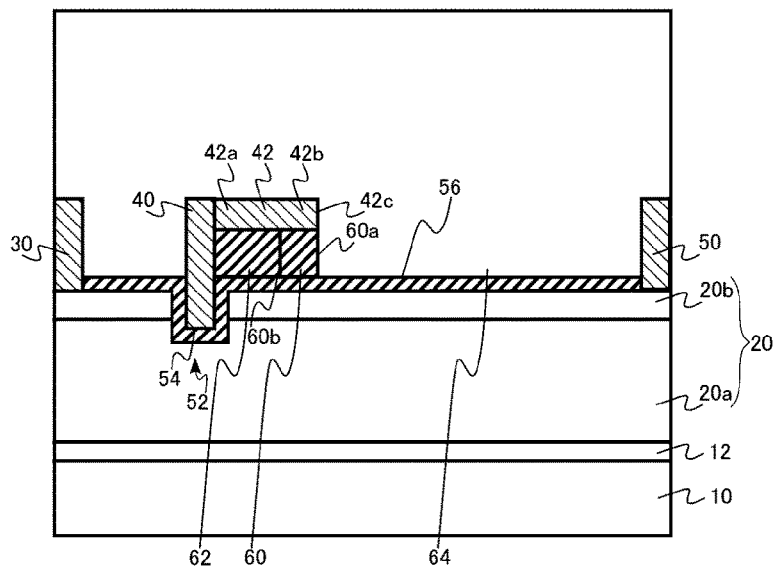
FIG. 16 is a schematic cross-sectional view of a semiconductor device according to an eighth embodiment.

FIG. 16 is a schematic cross-sectional view of the semiconductor device 800 according to the embodiment. The semiconductor device 800 according to the embodiment is a normally-off semiconductor device.

Also in the semiconductor device 800 according to the embodiment, it is possible to provide a normally-off semiconductor device having high breakdown voltage property.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first nitride semiconductor layer;
   a source electrode on the first nitride semiconductor layer;
   a drain electrode on the first nitride semiconductor layer;
   a gate electrode on the first nitride semiconductor layer and between the source electrode and the drain electrode;
   a gate field plate electrode that is separated from the first nitride semiconductor layer, and includes one end in direct contact with the gate electrode, and the other end positioned between the gate electrode and the drain electrode;
   a first interlayer insulating film that is separated from the gate electrode and is between the gate field plate electrode and the first nitride semiconductor layer, wherein the first interlayer insulating film includes silicon oxide, benzocyclobutene or polyimide; and
   a second interlayer insulating film that is between the gate electrode and the first interlayer insulating film and has a dielectric constant higher than a dielectric constant of the first interlayer insulating film.

2. The device according to claim 1, wherein the first interlayer insulating film is in direct contact with the gate field plate electrode and the first nitride semiconductor layer.

3. The device according to claim 1, further comprising:
   a third interlayer insulating film that is between the first interlayer insulating film and the drain electrode and has a dielectric constant higher than the dielectric constant of the first interlayer insulating film.

4. The device according to claim 3, wherein the second interlayer insulating film includes silicon nitride, aluminum oxide, strontium titanate or barium titanate.

5. The device according to claim 1, wherein the first nitride semiconductor layer includes a first semiconductor layer, and a second semiconductor layer on the first semiconductor layer, the second semiconductor layer having a band gap that is larger than a band gap of the first semiconductor layer.

6. The device according to claim 5, further comprising:
   a gate insulating film between the second semiconductor layer and the gate electrode.

7. The device according to claim 6, wherein the gate electrode and the gate insulating layer extend below an upper surface of the second semiconductor layer.

8. The device according to claim 6, wherein the gate electrode and the gate insulating layer extend below an upper surface of the first semiconductor layer.

9. The device according to claim 1, further comprising:
   a source field plate electrode that is above the gate field plate electrode, separated from the first nitride semiconductor layer, and has one end in direct contact with the source electrode, and the other end between the source electrode and the drain electrode.

10. The device according to claim 1, further comprising:
    a substrate; and
    a second nitride semiconductor layer between the first nitride semiconductor layer and the substrate.

11. The device according to claim 1, further comprising:
    a p-type nitride semiconductor layer between the first nitride semiconductor layer and the gate electrode.

12. The device according to claim 1, wherein a distance from the other end of the gate field plate electrode to the drain electrode is equal to a distance from an end of the first interlayer insulating film facing the drain electrode to the drain electrode.

13. The device according to claim 1, wherein a distance from the other end of the gate field plate electrode to the drain electrode is less than a distance from an end of the first interlayer insulating film facing the drain electrode to the drain electrode.

14. The device according to claim 1, wherein a distance from the other end of the gate field plate electrode to the drain electrode is greater than a distance from an end of the first interlayer insulating film facing the drain electrode to the drain electrode.

15. A semiconductor device, comprising:
a first nitride semiconductor layer;
a source electrode on the first nitride semiconductor layer;
a drain electrode on the first nitride semiconductor layer;
a gate electrode on the first nitride semiconductor layer and between the source electrode and the drain electrode;
a source field plate electrode that is separated from the first nitride semiconductor layer, and includes one end in direct contact with the source electrode, and the other end positioned between the gate electrode and the drain electrode;
a first interlayer insulating film that is separated from the source electrode and is between the source field plate electrode and the first nitride semiconductor layer; and
a second interlayer insulating film that is between the source electrode and the first interlayer insulating film and has a dielectric constant higher than a dielectric constant of the first interlayer insulating film.

16. The device according to claim 15, further comprising:
a third interlayer insulating film that is between the source field plate electrode and the first nitride semiconductor layer and between the first and second interlayer insulating films, the third interlayer insulating film having a dielectric constant higher than the dielectric constant of the first interlayer insulating film and lower than the dielectric constant of the second interlayer insulating film.

17. The device according to claim 16, further comprising:
a gate field plate electrode that is separated from the first nitride semiconductor layer, and includes one end in direct contact with the gate electrode, and the other end positioned between the gate electrode and the third interlayer insulating film;
a fourth interlayer insulating film that is separated from the gate electrode and is between the gate field plate electrode and the first nitride semiconductor layer; and
a fifth interlayer insulating film that is between the gate electrode and the fourth interlayer insulating film and has a dielectric constant higher than a dielectric constant of the fourth interlayer insulating film.

18. The device according to claim 17, further comprising:
a sixth interlayer insulating film that is between the fourth and fifth interlayer insulating films and has a dielectric constant higher than the dielectric constant of the fourth interlayer insulating film and lower than the dielectric constant of the fifth interlayer insulating film.

19. The device according to claim 15, further comprising:
a substrate; and
a second nitride semiconductor layer between the first nitride semiconductor layer and the substrate, wherein the first nitride semiconductor layer includes a first semiconductor layer, and a second semiconductor layer on the first semiconductor layer, the second semiconductor layer having a band gap that is larger than a band gap of the first semiconductor layer.

* * * * *